United States Patent

Marth

(12) United States Patent
(10) Patent No.: US 6,800,984 B2
(45) Date of Patent: Oct. 5, 2004

(54) PIEZO LINEAR DRIVE WITH A GROUP OF PIEZO ACTUATOR STACKS AS WELL AS METHOD FOR OPERATING SUCH A DRIVE

(75) Inventor: Harry Marth, Waldbronn (DE)

(73) Assignee: Physik Instrumente (PI) GmbH & Co. KG, Karlsruhe (DE)

(*) Notice: Subject to any disclaimer, the term of this patent is extended or adjusted under 35 U.S.C. 154(b) by 0 days.

(21) Appl. No.: 10/166,660

(22) Filed: Jun. 12, 2002

(65) Prior Publication Data

US 2003/0085633 A1 May 8, 2003

(30) Foreign Application Priority Data

Jun. 12, 2001 (DE) .......................................... 101 28 497
Sep. 28, 2001 (DE) .......................................... 101 48 267
May 22, 2002 (DE) .......................................... 102 22 592

(51) Int. Cl.$^7$ .............................................. H01L 41/08
(52) U.S. Cl. .................. 310/323.02; 310/328; 310/366
(58) Field of Search .............................. 310/328, 323.02

(56) References Cited

U.S. PATENT DOCUMENTS

| | | | | |
|---|---|---|---|---|
| 4,947,077 A | * | 8/1990 | Murata | ....................... 310/328 |
| 5,027,028 A | * | 6/1991 | Skipper | ....................... 310/328 |
| 5,068,566 A | * | 11/1991 | Culp | ........................... 310/328 |
| 5,136,201 A | * | 8/1992 | Culp | ........................... 310/328 |
| 5,939,816 A | * | 8/1999 | Culp | ........................... 310/328 |
| 6,066,911 A | * | 5/2000 | Lindemann et al. | ... 310/323.02 |

* cited by examiner

*Primary Examiner*—Mark Budd
(74) *Attorney, Agent, or Firm*—Oblon, Spivak, McClelland, Maier & Neustadt, P.C.

(57) ABSTRACT

A piezo linear drive including a group of piezo actuator stacks configured to drive a moving member located in a guidance device, and located on a joint substrate in a hybrid arrangement; wherein within a stack extending from the substrate a first stack part is configured as a longitudinal actuator and a second stack part is configured as a shearing actuator, the second stack part is equipped with a wear-resistant end plate which is in at least one of a clamping contact and shearing contact with the moving member, and at least two identical motors are located adjacent to each other in order to perform alternating clamping and advancing movements during a stepping operation.

19 Claims, 6 Drawing Sheets

PIEZO LINEAR DRIVE WITH A GROUP OF PIEZO ACTUATOR STACKS AS WELL AS METHOD FOR OPERATING SUCH A DRIVE

CROSS-REFERENCE TO RELATED APPLICATIONS

This application claims benefit of priority under 35 U.S.C. § 119 to German Patent Application Serial No. 101 28 497.7, filed on Jun. 12, 2001, German Patent Application Serial No. 101 48 267.1, filed on Sep. 28, 2001, and German Patent Application Serial No. 102 22 592.3, filed on May 22, 2002, the entire contents of which are incorporated

BACKGROUND OF THE INVENTION

1. Field of the Invention

The present invention relates generally to piezoelectric drives, and more particularly to a piezo linear drive with a group of piezo actuator stacks for driving a moving member located in a guiding device. Furthermore, the present invention provides a method for operating a piezo linear drive.

2. Discussion of the Background

Multi-layer actuator stacks made of piezoceramic materials have been state of the art for many years. In piezoelectric drives, electrical energy is converted into movement by utilizing the electrostrictive effect, of one or more piezoelectric elements. In a piezoelectric drive that utilizes the longitudinal electrostrictive effect, the amount of the shift per unit length of the actuator is largely proportional to the intensity of the field that is applied. For a high degree of displacement it is necessary that a large tension be applied between the generally opposing electrodes or the distance between the electrodes must be reduced.

Monolithic multi-layer actuators are known to increase the piezoelectric effect and consist of a sintered stack of thin films of piezoceramic (for example, lead zirconate titanate with embedded metallic inner electrodes). The inner electrodes are alternately guided out of the stack and connected electrically via outer electrodes. When electric tension is applied to the outer electrodes, the piezo films expand in the field direction. This mechanical series connection of the individual piezo films accomplishes the nominal expansion of the entire piezoceramic already at low electric tension values. Such multi-layer actuators are known for example from publication DE 4036287 C2.

Furthermore, so-called micro-motors are used for moving a body, as disclosed, for example, in publication EP 633616 A2. Such motors comprise at least one piezoelectric plate, wherein electrodes are arranged on the plate surfaces. Bending forces are transmitted to a moving member with the help of a spacer which is located in the oscillation node on the piezoelectric plate.

Particularly in the case of adjusting and positioning devices, for example, with regard to optical components, movements in random degrees of freedom are frequently required, wherein an extremely high degree of positioning accuracy and high retaining forces must be achieved.

Although when using piezo actuators that operate in the $d_{33}$ mode (electrical field and displacement parallel to the polarization direction) relatively large changes in length can be accomplished, it is problematic to realize large travel ranges of several hundred micrometers.

U.S. Pat. No. 6,150,750 teaches a piezoelectric linear stepping motor, wherein a configuration is used which includes actuators that represent a hybrid arrangement located on a joint substrate. Within a cylindrical stack configuration a first stack part is arranged as a longitudinal actuator and a second stack part as a shearing actuator. Monolithic ceramics with an insulation layer require a relatively high operating voltage which results in a reduced overall efficiency. According to one embodiment of this U.S. patent, a relatively fast approach to a basic position with a subsequent time-resolved fine positioning is not possible.

SUMMARY OF THE INVENTION

Accordingly, an object of the invention is to provide a piezo linear drive including a group of piezo actuator stacks which drive a moving member located in a guiding device. The piezo linear drive is configured to travel greater travel ranges within a short period of time and make possible a fine positioning with a high degree of accuracy on or near a target.

Yet, another object of the invention is to provide a drive having the necessary stiffness and which ensures great retaining forces independent of the respective position in the space.

Still yet another object of the invention is to provide a method for operating such a piezo linear drive.

These and other objects of the present invention are achieved by providing a novel piezo linear drive and a method for operating the same. The piezo linear drive includes a group of piezo actuator stacks configured to drive a moving member located in a guidance device, and located on a joint substrate in a hybrid arrangement; wherein within a stack extending from the substrate a first stack part is configured as a longitudinal actuator and a second stack part is configured as a shearing actuator, the second stack part is equipped with a wear-resistant end plate which is in at least one of a clamping contact and shearing contact with the moving member, and at least two identical motors are located adjacent to each other in order to perform alternating clamping and advancing movements during a stepping operation.

Fundamentally, the present invention provides that several special hybrid actuators made of multilayer ceramic are located on a joint substrate, wherein within one stack of such an actuator, extending from the substrate, a first stack part is designed as a longitudinal actuator and a second stack part as a shearing actuator. The latter stack part is equipped with a wear-resistant end plate, preferably made of ceramic, which is in clamping and/or shearing contact with the moving member. At least two identical actuators of this kind are arranged adjacent to each other in order to perform alternating clamping and feed movements relative to the moving member during the stepping operation.

BRIEF DESCRIPTION OF THE DRAWINGS

A more complete appreciation of the invention and many of the attendant advantages thereof will be readily obtained as the same becomes better understood by reference to the following detailed description when considered in combination with the accompanying drawings, wherein.

DETAILED DESCRIPTION OF THE PREFERRED EMBODIMENTS

In a preferred embodiment of the invention, at least two actuators, respectively, are arranged lying opposite one another with respect to the moving member in order to perform phase-opposition alternating clamping and feed movements. A preferred driving module contains 4, 6, 8 to n (n=an integer) actuators, wherein the odd-numbered and the even-numbered actuators, respectively, are interconnected in parallel for the purpose of a load distribution.

Between the actuators located on a mutual substrate, a gap and/or distance is provided which is adjusted with regard to shearing movements. By using multi-layer ceramics, the maximum operating voltage and/or the electrical field strength is reduced such that no additional insulating layers are required.

With regard to the method for operating the above described piezo linear drive, a rough positioning of the drive is activated in the stepping mode, wherein neighboring and/or opposing actuators perform the desired clamping and feed movements in an alternating or alternating phase-opposition manner. The control voltage is made available through an appropriate generator in the desired pulse and/or step width.

For the purpose of fine positioning, every other stack part of the actuators is connected in parallel and placed in analog mode so that in an area around a current mean position, the exact target position of the moving member can be adjusted at considerably lower tension compared to the stepping operation. In the energy-less or analog mode, all first stack elements are in a clamping position in order to create the desired retaining forces and stiffness.

Pursuant to a second object of the invention, the actuators are configured in an array or quadrant arrangement of at least four stacks, wherein the diagonally opposite stacks of an actuator, respectively, are connected in parallel. This embodiment enables the ability to incorporate apart from the first and the second stack elements a third stack part as an additional shearing actuator, wherein a direction of movement is offset in the second and the third stack part. That is, the two shearing actuators are offset by 90°. Consequently, different directions of movement of the allocated moving member can be realized.

Pursuant to a third object of the invention, at least one actuator, respectively, is used which is arranged opposite from the moving member and drives. Each of the actuators has a symmetrical design and comprises outer sections connected electrically in parallel as well as at least one inner section. The separating gap between the sections runs parallel and is oriented in the longitudinal direction of the moving member.

In this beneficial variation of the invention, no undesirable vibration forces are generated which can be transmitted to the moving member and the driven device and which are triggered by the change during a transition between shearing and clamping. The parallel orientation of the actuators relative to the longitudinal direction of the moving member, wherein the moving member in turn is arranged preferably symmetrical to the axis of symmetry of the actuators, affects the application of a possible force over a larger, almost undisturbed surface, with the corresponding continuous transition between the movement steps.

The mode of operation of such a drive can be described as follows. The actuators, which lie opposite with respect to the moving member, contain the above-mentioned outer sections that are connected in parallel. When selecting the outer sections, the shearing actuators become active in the same direction and the moving member moves by the specified shearing amount in its longitudinal direction through forces applied from the outside. Subsequently the opposite inner sections are activated. The shearing forces of the inner sections run in the opposite direction relative to those of the outer sections. This way, to overshooting can be avoided effectively.

According to another embodiment, which basically unites all above-mentioned characteristics, an arrangement of the actuators with standardized two-pole wiring is provided. This is accomplished with an electrode arrangement, which runs between the stack elements and bridges the separating gap between the actuators. The actuators in this embodiment are stacked alternately parallel or antiparallel to the polarization direction of the electrode, corresponding to the clamping and shearing movements that need to be performed. This embodiment allows all piezo actuator stacks to be selected and connected collectively.

Beneficially, the continuous electrode configuration is formed as a unit of continuous films running between the stack elements, with these films containing connecting rails at the separating gap located between the actuators in order to provide adjustment in the flexural strength of the films. This minimizes a disadvantageous influence of the electrode configuration on the clamping and feeding movements that are performed.

According to another usefull aspect of this embodiment, the electrode configuration includes a continuous wiring on a first and a last actuator that are connected by the continuous wiring, which leads to a control generator. In accordance with this embodiment, the number of control lines and control generators is reduced considerably. The actuator configuration in the two-pole wiring system is selected by a generator solely with a standardized control signal, at least with regard to the clamping movement of the actuators.

The piezo linear drive pursuant to the description found below represents a hybrid system. In concrete terms, the linear drive is realized in two modes. A rough approximation to the target position is accomplished via a stepping mode. The piezo actuators that are used can be divided into clamping and advancing piezos, which are alternately connected.

The step size of these piezos can be adjusted and lies, for example, in the range of 0.1 to 2 $\mu$m. Upon approaching the target position, the clamping piezos are transferred into an electrically idle state, wherein the moving member remains clamped.

A fine positioning in an analog mode then occurs exclusively through the advancing piezos, which can realize an adjustment range of basically 2 $\mu$m and which operate symmetrically to the center position. In the analog mode, the nominally permissible field strength of the advancing piezos is maximally only at 25 percent of the field strength (500 V/mm), which is used in $d_{33}$ actuators in air (2,000 V/mm).

When approaching the target position via the stepping mode of 0.1 μm, the advancing piezos are operated with only 1 to 2 percent of the nominal field strength of air when switching to the analog mode. This is of considerable benefit to the long-term stability of the configuration. If larger deviations than those covered by the analog adjusting range occur, or if the required operating field strengths are too high, the mean position can be adjusted again by switching to a single-step operation.

The hybrid system guarantees positioning ranges of several hundred micrometers with a resolution of a few nanometers. The load capacity is in the range of several kilograms with resonant frequencies of several hundred Hertz. The positioning processes can be selected and triggered very quickly, and this leads to a compact design. The power dissipation is less than in direct piezo drives or piezo actuators with integrated path change due to the selection of the operating mode. Due to the low effective DC field strengths, service life expectancy specifications as they are provided for technological specialty equipment are achieved.

Figure 1:
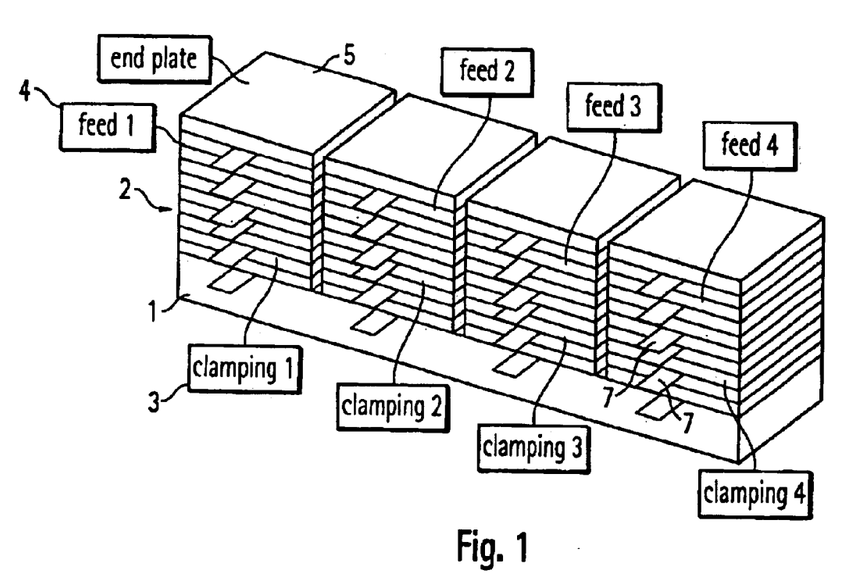
FIG. 1 is a basic depiction of a driving module for the piezo linear drive.
Figure 3:
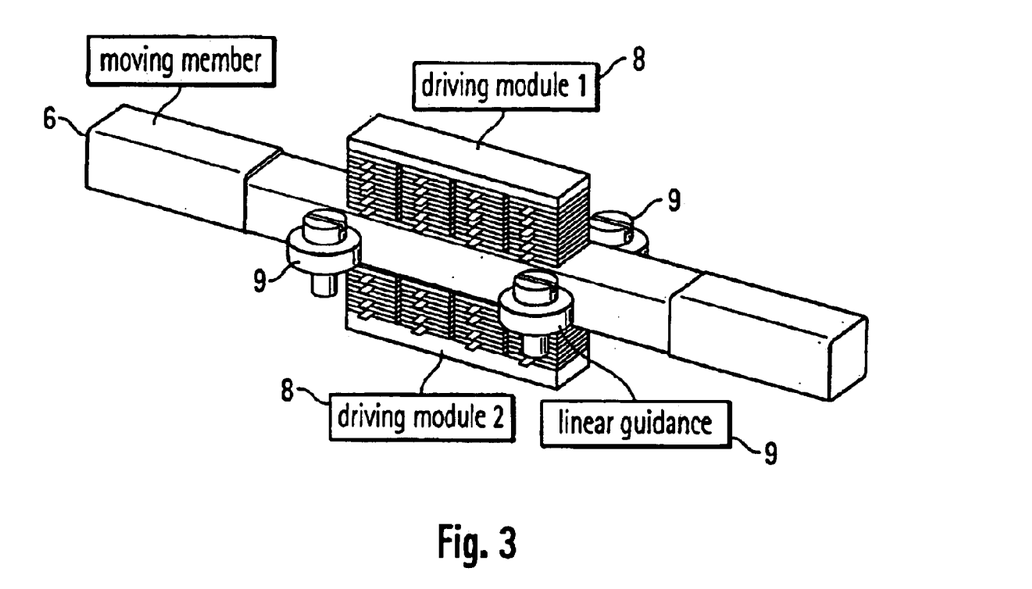
FIG. 3 illustrates a realized piezo linear drive including two opposite driving modules and linear guidance.

The piezo linear motor shown in FIG. 1 contains hybrid actuators 2 which are located on a mutual substrate 1. The hybrid actuators 2 contain a first stack part 3 for clamping as well as a second stack part 4 for the necessary advancing and shearing movements. A wear-resistant end plate 5 is connected with a moving member 6 (FIG. 3). The desired electric connection of the individual hybrid actuators 2 occurs via electrodes 7.

As depicted, for example, four identical piezo ceramic stacks can be incorporated on a mutual substrate 1, wherein the stacks as described are divided into two sections. The first stack elements operate as $d_{33}$ actuators and are required for the vertical clamping movement vertical to the running direction. The upper, second stack part operates in the shearing mode in the horizontal running direction.

Figure 2:
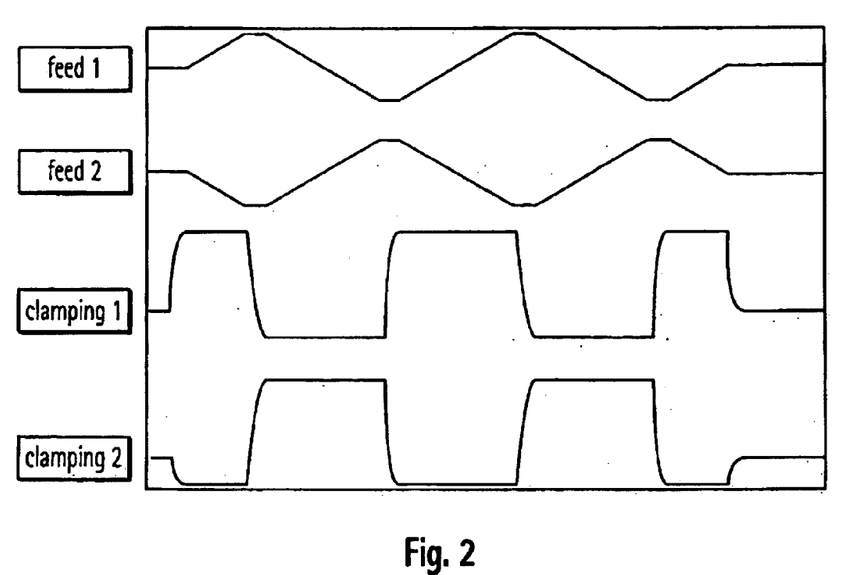
FIG. 2 provides examples of operating voltage curves of the piezo linear motor.

As shown in FIG. 2, all actuators are electrically selected in the sense that in the stepping operation all end plates 5 perform alternating phase-opposition pressing and feeding movements. This results in a step-shaped shift of the coupled moving member 6 (FIG. 3). In order to reverse the direction of movement, the advancing or clamping tensions are inverted, respectively. The third and fourth actuators are connected in parallel with the first and second actuators for better load distribution.

As can be seen from the depiction of the operating voltage curve on the piezo linear motor according to FIG. 2, a minimum of two clampings are closed at any time in the stepping mode. Consequently, even during vertical operation, no slipping of the moving member 6 can occur. This applies both for the energy-less state and the analog mode in which all four clampings are closed and where the largest retaining force and stiffness of the overall configuration is achieved.

In the analog mode, all advancing piezos, that is, the second stack elements, operate parallel and behave like a familiar PZT stack with a small travel range of a few micrometers.

FIG. 3 shows an embodiment of a piezo linear drive with two driving modules 8 connected in parallel in order to increase the adjusting forces. The driving modules 8 are pressed from beneath and above against the moving member 6 located in the center by a symmetrical pre-load and are connected in the adjusting direction with a case (which is not depicted) via the continuous substrate 1 in as rigid a manner as possible. A linear guidance 9 then enables the desired movement of the moving member 6 upon activation of the driving module 8.

As an example, the driving modules 8 have a size of 5×5×20 mm,$^2$ wherein travel ranges in the range of 10 mm can be achieved with a step size of a maximum of 2 μm and a minimum of 50 to 100 nm. The travel range in the analog mode is in the range of 2.5 μm with a resolution of <0.1 nm in dependency upon the signal-to-noise ratio of the respective selection electronic system.

It is in accordance with the invention that not only, as shown in the example, moving members with square or rectangular cross-sections are used, but also members having circular or elliptic shape are used. In accordance with this embodiment, the end plates, which act as friction and power transmission elements, must be adjusted.

Moreover, the driving modules can comprise not only four, but larger groups of 6, 8 or n actuators. In the case of a circular arc moving member for rotating drives, the joint substrate of the respective driving modules and the modules are adjusted to the circular arc shape of the moving member.

In the selected design, selection in the stepping mode occurs in such a way that the striking surfaces on the actuator and moving member do not perform any relative movements to each other when they are under great pressing pressure. A movement of the advancing actuators occurs exclusively in the lifted-off state so that the wear between the opposing surfaces can be minimized.

Figure 4:
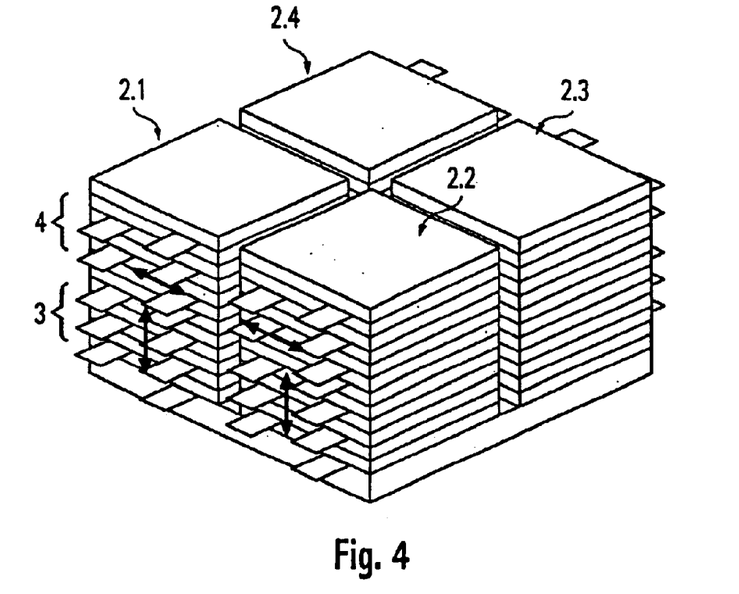
FIG. 4 illustrates a piezo linear drive with an array configuration of the actuators.

FIG. 4 depicts an embodiment of the piezo linear drive in an array or quadrant configuration of the actuators. Here at least four stacks are included, wherein the diagonally opposite stacks of an actuator, respectively, are connected in parallel. That is, stack 2.1 is connected with 2.3 and stack 2.2 with 2.4.

Figure 5:
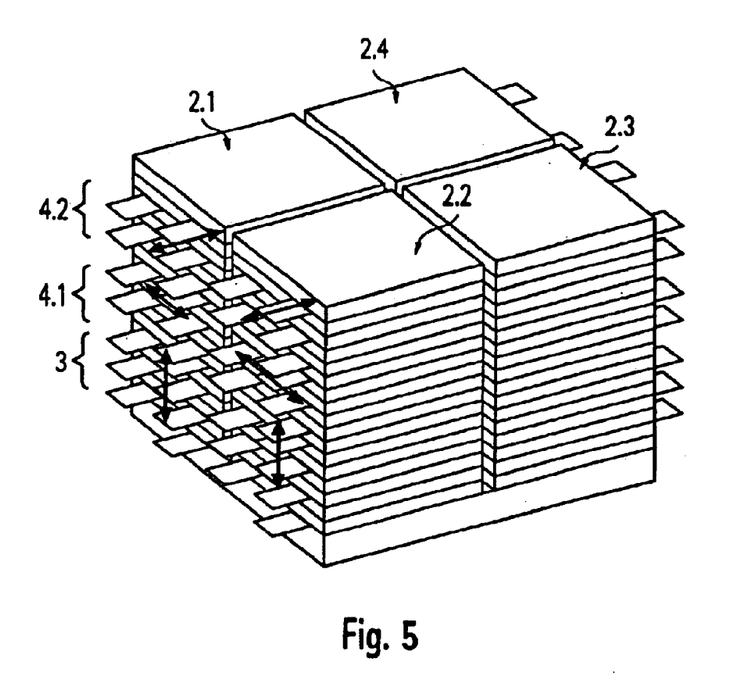
FIG. 5 illustrates a drive similar to FIG. 4, however, with a third stack part as an additional shearing actuator.

Pursuant to FIG. 5, there is the possibility within each stack to provide apart from the first stack part 3 for clamping and the second stack part 4.1, a third stack part 4.2 which acts as an additional shearing actuator. This additional shearing actuator 4.2 has a direction of movement, which is offset by 90° relative to the second stack part 4.1 in order that several degrees of freedom of movement of a driven moving member can be accomplished.

Figure 6:
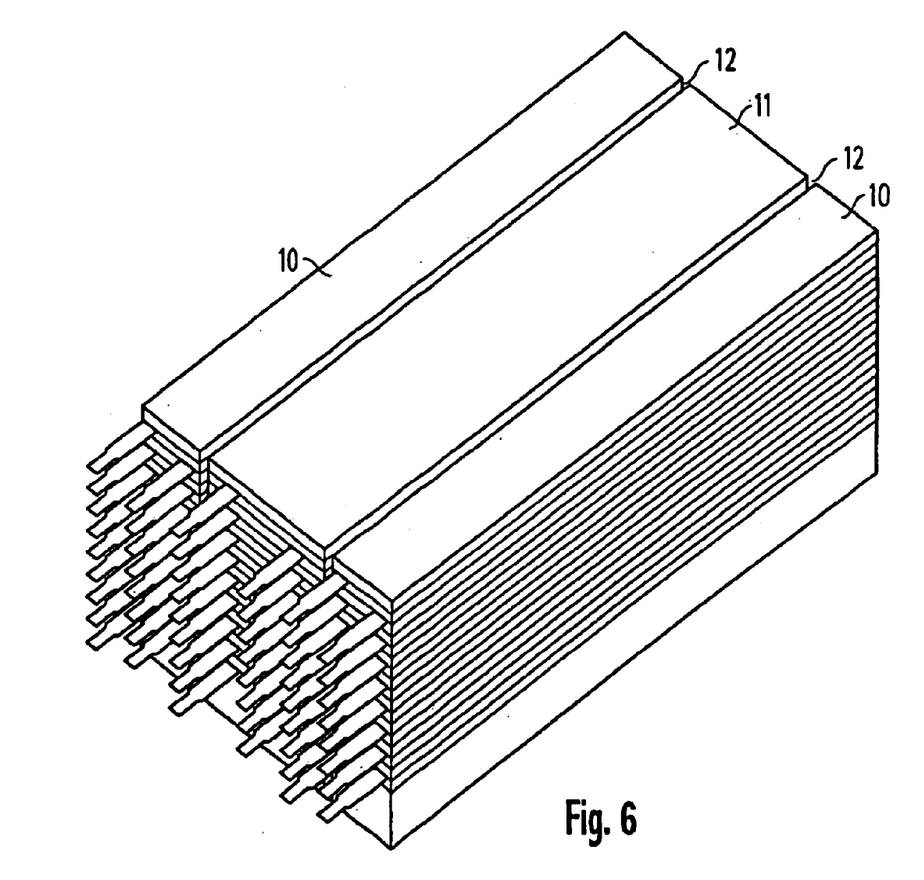
FIG. 6 illustrates a drive with an outer and inner section which are connected in parallel.

Another embodiment of the actuators, including multilayer ceramics, is illustrated in FIG. 6. Those actuators have a symmetrical design with outer sections 10 that are connected electrically in parallel as well as at least one inner section 11. The separating gap 12 runs parallel to the longitudinal axis, that is, in the direction of movement of the moving member (not shown). If a moving member is driven with two such opposing actuators in an analog fashion as shown in FIG. 3, then the alternating clamping and shearing forces act very evenly, which leads to an almost continuous oscillation-free movement so that the properties of the drive are improved overall.

Figure 7:
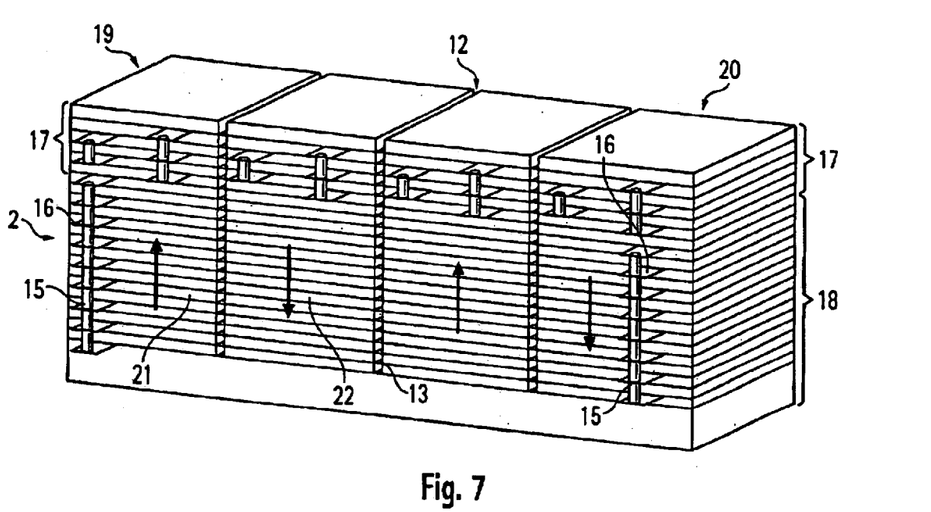
FIG. 7 illustrates an actuator configuration for a piezo linear drive similar to FIG. 1, but in a two-pole wiring system with a continuous electrode configuration.
Figure 8:
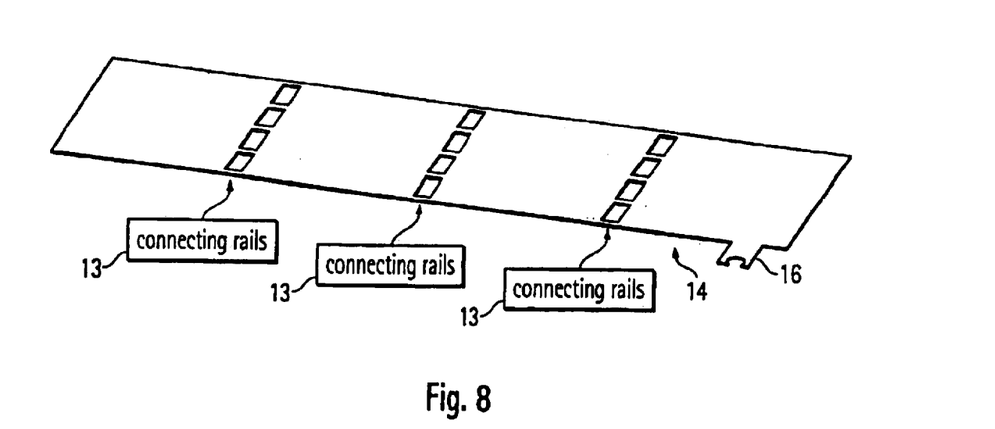
FIG. 8 illustrates a depiction of a continuous film as a component of the electrode configuration of FIG. 7.

An embodiment with regard to the selection as well as the wiring of the actuators is shown in FIGS. 7 and 8 as an example of a linear configuration of piezo actuators. FIG. 7 shows a possibility for selecting the entire actuator configuration with regard to their clamping movements through a two-pole wiring system. The hybrid actuators 2 are connected with each other continuously in a lower partial area by a series of conductive films 14 that bridge the separating gap 12 and are equipped with connecting rails 13. The conducting films are inserted between the first stack elements 3 for clamping purposes. The design of the films 14 enables continuous wiring 15 via contact areas 16 on a first actuator 19 and a second actuator 20. Within an advancing section 17, the hybrid actuators 2 are stimulated to perform the above-mentioned linear driving shearing movements through an already-described electrode arrangement.

In a clamping section 18, a clamping movement of the actuators is caused by means of the continuous films 14. The actuators are stacked within the clamping section in such a way that within a first actuator, in the case of a parallel stack configuration 21, the stack elements are stacked in a parallel direction to a polarization direction applied from the outside. While in the case of an anti-parallel stack configuration 22, the stack elements are oriented anti-parallel to the polarization direction. An electrical field applied between the continuous films 14 causes an extension or shortening of the appropriate actuator in the clamping area, wherein the entire actuator configuration is controlled uniformly by means of the wiring systems 15. The clamping movement of the actuator configuration is thus created with only one generator. Thus, reducing the entire number of generators in the example shown in FIG. 7 from 4 to 3 compared to previously mentioned examples. Furthermore, the necessary outer wiring in this example is reduced from 8 to 3. Tests have shown that in an actuator configuration such as the one shown in FIG. 7, a reduction in the necessary contacts and internal soldering areas from 88 to 37 can occur, which creates a considerable advantage in the production of such a linear drive. Additionally, it increases the material stiffness of the piezo drive.

The continuous films 14 can compensate the alternating movements during the clamping movements without difficulty due to their low thickness. Additionally, however, it is possible by means of the configuration shown in FIG. 8 including connecting rails 13, which can be incorporated into the film 14 in an optimal manner, to adjust the mechanical properties of the film 14 in the area of the separating gap to the movement of the actuators.

Obviously, numerous modifications and variations of the present invention are possible in light of the above teachings. It is therefore to be understood that within the scope of the appended claims, the invention may be practiced otherwise then specifically described herein.

What is claimed is:

1. A piezo linear drive, comprising:
   a group of piezo actuator stacks configured to drive a moving member located in a guidance device, and located on a joint substrate in a hybrid arrangement;
   wherein within a stack extending from the substrate a first stack part is configured as a longitudinal actuator and a second stack part is configured as a shearing actuator, the second stack part is equipped with a wear-resistant end plate which is in at least one of a clamping contact and shearing contact with the moving member, at least two identical motors are located opposite to each other in order to perform alternating clamping and advancing movements during a stepping operation and every other or every third stack part of the first and second actuators is connected in parallel.

2. The piezo linear drive pursuant to claim 1, wherein at least two actuators, respectively, are arranged opposite with respect to the moving member in order to perform phase-opposition alternating clamping and advancing movements.

3. The piezo linear drive pursuant to claim 1, further comprising:
   a driving module including 4, 6, 8 to n (n=integer) actuators;
   wherein for the purpose of load distribution the odd-numbered and even-numbered actuators, respectively, are electrically interconnected in parallel.

4. The piezo linear drive pursuant to claim 1, wherein a distance that is adjusted to the shearing movement is provided between the actuators located on the joint substrate.

5. The piezo linear drive pursuant to claim 1, wherein the actuators are designed in an quadrant configuration of at least four stacks and the respective diagonally opposite stacks of an actuator are selected in parallel.

6. The piezo linear drive pursuant to claim 5, wherein within each stack, apart from the first and the second stack parts, a third part is provided as an additional shearing actuator, and the direction of movement is preferably offset by 90° between the second and third stack part.

7. A method for operating a piezo linear drive according to claim 1, comprising the steps of:
   performing a clamping movement using a first actuator including a plurality of stack parts;
   performing a feeding movement using a second actuator in an alternating or alternating phase opposition manner, wherein the second actuator includes a plurality of stack parts; and
   selecting electrically the fist and second actuators;
   wherein for rough positioning a drive occurs in a stepping mode, and for fine positioning the drive occurs in an analog mode and a target position of the moving member can be adjusted.

8. The method pursuant to claim 7, wherein in an energy-less state or the analog mode, all first stack elements are in the clamping mode in order to achieve the desired retaining force and stiffness.

9. A piezo linear drive, comprising:
   a group of piezo actuator stacks configured to drive a moving member located in a guidance device, and located on a joint substrate in a hybrid arrangement;
   wherein within a stack extending from the substrate a first stack part is configured as a longitudinal actuator and a second stack part is configured as a shearing actuator, the second stack part is equipped with a wear-resistant end plate which is in at least one of a clamping contact and shearing contact with the moving member in order to perform alternating clamping and feeding movements during a stepping operation, at least one actuator comprising a multi-layer ceramic is arranged lying opposite relative to the respective moving member, opposing actuators each have a symmetrical design comprising outer sections that are connected electrically in parallel as well as an inner section, the separating gap between the sections is oriented parallel and in the longitudinal direction of the moving member, and every other stack part of the first and second actuators is connected in parallel.

10. A method for operating a piezo linear drive according to claim 9, including the steps of:
   performing a clamping movement using a first actuator including a plurality of stack parts;
   performing a feeding movement using a second actuator in an alternating or alternating phase opposition manner, wherein the second actuator includes a plurality of stack parts and is opposed to the first actuator; and
   selecting electrically the fist and second actuators;
   wherein for rough positioning a drive occurs in a stepping mode, for fine positioning the drive occurs in an analog mode and a target position of the moving member can be adjusted.

11. Piezo linear drive pursuant to claim 1, wherein the configuration of the actuators is equipped with a two-pole wiring system which at least in part is formed by a continuous electrode arrangement located between the actuators, the two pole wiring system bridges the separating gap and runs between the stack elements, and the actuators are stacked alternately parallel and anti-parallel to the polarization direction of the electrode corresponding to the clamping and advancing movements that need to be performed.

12. Piezo linear drive pursuant to claim 11, wherein the continuous electrode arrangement is designed as a unit of continuous films arranged between the stack elements of the actuators, and the films include connecting rails on the separating gap located between the actuators in order to adjust the stiffness.

13. Piezo linear drive pursuant to claim 11, wherein the electrode arrangement contains a continuous wiring system on a first and a last actuator.

14. Method for operating a piezo linear drive pursuant to claim 11, comprising the step of:

driving the arrangement of actuators by a single generator with a uniform control signal.

15. Piezo linear drive pursuant to claim 9, wherein the configuration of the actuators is equipped with a two-pole wiring system which at least in part is formed by a continuous electrode arrangement located between the actuators, the two pole wiring system bridges the separating gap and runs between the stack elements, and the actuators are stacked alternately parallel and anti-parallel to the polarization direction of the electrode corresponding to the clamping and advancing movements that need to be performed.

16. Piezo linear drive pursuant to claim 15, wherein the continuous electrode arrangement is designed as a unit of continuous films arranged between the stack elements of the acuators, and the films include connecting rails on the separating gap located between the acuators in order to adjust the stiffness.

17. Piezo linear drive pursuant to claim 15, wherein the electrode arrangement contains a continuous wiring system on a first and a last actuator.

18. Method for operating a piezo linear drive pursuant to claim 15, comprising the step of:

driving the arrangement of actuators by a single generator with a uniform control signal.

19. Piezo linear drive pursuant to claim 7, wherein the first and second acuators neighbor one another, oppose one another, or neighbor and oppose one another.

* * * * *